US009173031B2

United States Patent
Siek

(10) Patent No.: US 9,173,031 B2
(45) Date of Patent: Oct. 27, 2015

(54) APPARATUS AND METHOD FOR AMPLIFICATION OF AUDIO CONTENT

(75) Inventor: Ee Hui Siek, Singapore (SG)

(73) Assignee: Creative Technology Ltd, Singapore (SG)

( * ) Notice: Subject to any disclaimer, the term of this patent is extended or adjusted under 35 U.S.C. 154(b) by 651 days.

(21) Appl. No.: 13/510,894

(22) PCT Filed: Nov. 16, 2010

(86) PCT No.: PCT/SG2010/000431

§ 371 (c)(1), (2), (4) Date: May 18, 2012

(87) PCT Pub. No.: WO2011/068473

PCT Pub. Date: Jun. 9, 2011

(65) Prior Publication Data

US 2012/0230518 A1 Sep. 13, 2012

(30) Foreign Application Priority Data

Dec. 1, 2009 (SG) ................................ 200907967

(51) Int. Cl.
*H03F 99/00* (2009.01)
*H04R 5/04* (2006.01)

(52) U.S. Cl.
CPC ........................................ *H04R 5/04* (2013.01)

(58) Field of Classification Search
CPC ........................................................ H04R 5/04
USPC ........................................................ 381/120
See application file for complete search history.

(56) References Cited

U.S. PATENT DOCUMENTS

| | | | | |
|---|---|---|---|---|
| 7,813,824 | B2 * | 10/2010 | Takahama | 700/94 |
| 2001/0018621 | A1 | 8/2001 | Weikel et al. | |
| 2004/0203278 | A1 * | 10/2004 | Lin et al. | 439/502 |
| 2005/0058309 | A1 * | 3/2005 | Poling et al. | 381/123 |
| 2008/0025551 | A1 * | 1/2008 | Wehner | 381/401 |

FOREIGN PATENT DOCUMENTS

| | | | |
|---|---|---|---|
| CN | 201032746 | Y | 3/2008 |

* cited by examiner

*Primary Examiner* — Sonia Gay

(74) *Attorney, Agent, or Firm* — Russell Swerdon; Desmund Gean

(57) ABSTRACT

There is provided an apparatus and method for amplification of audio content. The apparatus includes a first power line connectable to a first connector of the plurality of data output connectors; a second power line connectable to a second connector of the plurality of data output connectors; an amplifier connected along each of the first and the second power lines; and a coil driver coupled to each of the amplifiers, the coil drivers being arranged such that magnetic summation occurs when the coil drivers are energized. The method also enables magnetic summation to occur when the coil drivers are energized.

8 Claims, 2 Drawing Sheets

APPARATUS AND METHOD FOR AMPLIFICATION OF AUDIO CONTENT

FIELD OF INVENTION

This invention relates to playback of audio content, particularly in relation to a method and apparatus for amplification of audio content.

BACKGROUND

There is a wide variety of speaker systems currently available for users. The wide variety of speaker systems allow users to obtain a type of speaker system which best suits their needs. The wide variety of speaker systems currently available may differ in parameters such as, for example, audio reproduction quality, power source, portability, appearance and so forth. There is little doubt that a power source for a speaker system is one of the primary considerations for the user when selecting a speaker system as this parameter directly affects the other aforementioned parameters of the speaker systems.

Typical power sources currently available for a speaker system include, for example, drawing of power from an AC mains supply, dry cell batteries, drawing of power from a connected audio content source, and so forth. There are currently issues relating to the use of the aforementioned typical power sources which affects the portability of the speaker system. It is evident that the drawing of power from an AC mains supply for a speaker system hampers the portability of such a system. Using dry cell batteries in the speaker systems also leads to inconveniences such as the excessive weight and limited life span of the dry cell batteries. In addition, drawing of power from a connected audio content source (for example, media player, PC, notebook, and so forth) typically is only for speaker systems with both low sound pressure level (SPL) and power ratings due to limitations stemming from a low amount of current which can be drawn from the connected audio content source. For the sake of illustration, a USB speaker system powered by a single USB port is restricted by USB specifications to draw 5V DC, 500 mA which provides a speaker system rated at only 1 W.

In view of the aforementioned, it is evident that there are issues relating to having a portable speaker system with both SPL and power ratings that are not compromised by drawing a low amount of current from the connected audio content source. In this regard, the present invention aims to address the aforementioned issues.

SUMMARY

In a first aspect, there is provided an apparatus for amplification of audio content, the apparatus being powered by a host device with a plurality of data output connectors. The apparatus includes a first power line connectable to a first connector of the plurality of data output connectors; a second power line connectable to a second connector of the plurality of data output connectors; an amplifier connected along each of the first and the second power lines; and a coil driver coupled to each of the amplifiers, the coil drivers being arranged such that magnetic summation occurs when the coil drivers are energized. It is advantageous that the magnetic summation causes the apparatus to attain a second sound pressure level (SPL) rating which is higher compared to a first SPL rating when only the first power line is connected to the first connector.

The apparatus may further include a line-in input for each of the amplifiers. Each amplifier may provide amplified line-in inputs to each respective coil driver. The line-in input may be either through or combined with at least one of the plurality of data output connectors. The data output connectors may be, for example, a USB connector, an IEEE1394 connector, any connector that allows hot swapping and the like.

Each of the coil drivers is not energized when a respective power line is disconnected from the plurality of data output connectors, with the coil drivers being for operation of a single speaker cone of the apparatus. The coil drivers may be arranged in either a parallel or a series arrangement.

In a second aspect, there is provided a method for amplifying audio content using an apparatus for amplification of audio content, the apparatus being powered by a host device with a plurality of data output connectors. The method includes connecting a first power line to a first connector of the plurality of data output connectors; connecting a second power line to a second connector of the plurality of data output connectors; feeding line-in inputs to an amplifier connected along each of the first and the second power lines; and energizing coil drivers coupled to each of the amplifiers, the coil drivers being arranged such that magnetic summation occurs when the coil drivers are energized. It is advantageous that the magnetic summation causes the apparatus to attain a second sound pressure level (SPL) rating which is higher compared to a first SPL rating when only the first power line is connected to the first connector.

Each of the plurality of data output connectors may be, for example, a USB connector, an IEEE1394 connector, any connector that allows hot swapping and so forth.

Each of the coil drivers is not energized when a respective power line is disconnected from the plurality of data output connectors, with the coil drivers being for operation of a single speaker cone of the apparatus. The coil drivers may be arranged in either a parallel or a series arrangement.

Each amplifier may provide amplified line-in inputs to each respective coil driver. The line-in inputs may be either through or combined with at least one of the plurality of data output connectors.

DESCRIPTION OF DRAWINGS

In order that the present invention may be fully understood and readily put into practical effect, there shall now be described by way of non-limitative example only preferred embodiments of the present invention, the description being with reference to the accompanying illustrative drawings.

DESCRIPTION OF PREFERRED EMBODIMENTS

Figure 1:
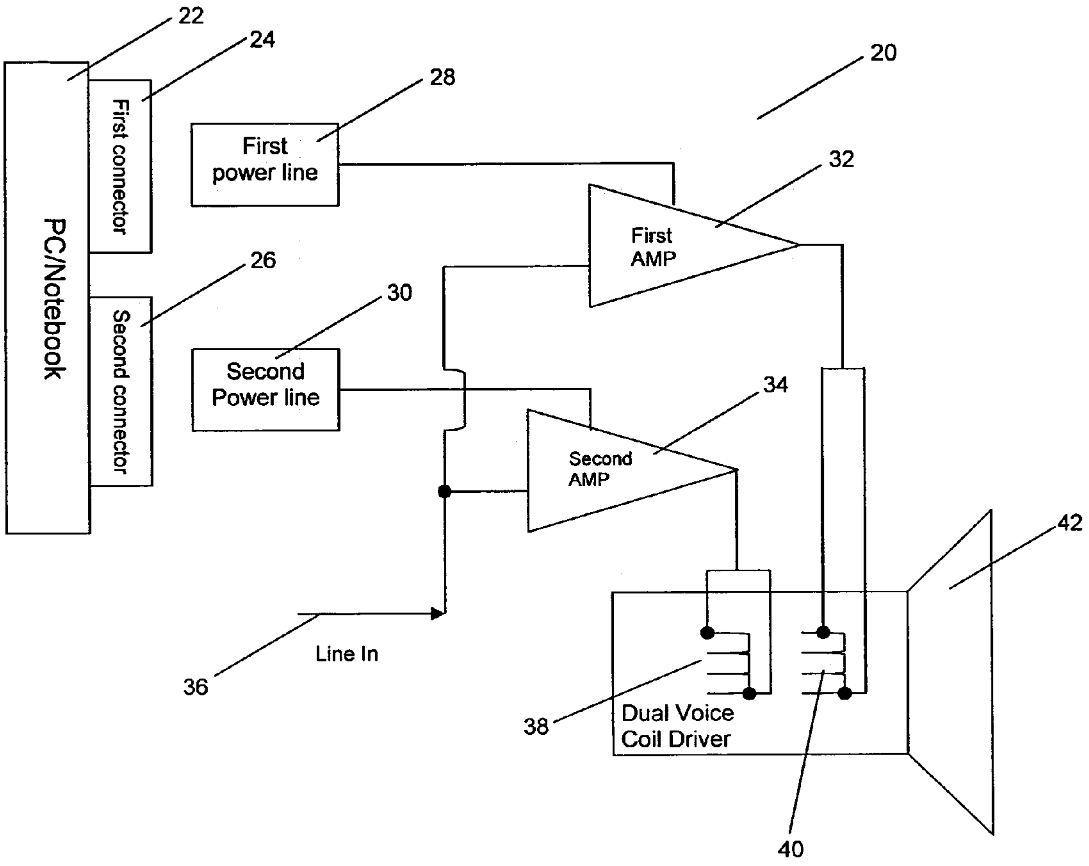
FIG. 1 shows a circuit diagram for a preferred embodiment of the apparatus.

In a first aspect of the present invention as shown in FIG. 1, there is shown an apparatus 20 for amplification of audio content. The apparatus 20 may be a speaker of any shape and form. The apparatus 20 may be powered by a host device 22 with a plurality of data output connectors. The host device 22 may include, for example, a PC, a notebook, a media player, and the like. The host device 22 may be known as such because power from the apparatus 20 is drawn from the host device 22.

The apparatus 20 includes a first power line 28 connectable to a first connector 24 of the plurality of data output connectors of the host device 22. There may also be a second power line 30 connectable to a second connector 26 of the plurality of data output connectors of the host device 22. Each of the plurality of data output connectors may be selected from, for example, a USB connector, an IEEE1394 connector, any connector that allows hot swapping, and so forth. The aforementioned examples of connectors are typically robust in construction and are able to withstand repeated couplings of the connector without affecting functional stability of the host device 22 after coupling of the data output connectors is performed.

The apparatus 20 may also include an amplifier 32, 34 connected along each of the first 28 and the second 30 power lines. Each of the first 28 and the second 30 power lines may have constraints in relation to an amount of current which is able to pass through each of the first 28 and the second 30 power lines. Each of the amplifiers 32, 34 may include a line-in input 36 for input of analog audio content. It should be appreciated that the line-in input 36 may be either independent (as shown in FIG. 1) or combined with at least one of the plurality of data output connectors.

There may be a coil driver 38, 40 coupled to each of the amplifiers 34, 32 respectively in the apparatus 20, with the coil drivers 38, 40 being arranged such that magnetic summation occurs when the coil drivers 38, 40 are energized. The coil drivers 38, 40 may be part of a dual voice coil speaker. Each amplifier 32, 34 may provide amplified line-in inputs to each respective coil driver 38, 40, where the coil drivers 38, 40 are for operation of a single speaker cone 42 of the apparatus 20. The coil drivers 38, 40 may be arranged in a manner such as per conventional dual voice coil speakers, typically in either a parallel or series arrangement. It should be appreciated that each of the coil drivers 38, 40 is not energized when a respective power line 30, 28 is disconnected from the plurality of data output connectors.

It is advantageous that the magnetic summation causes the apparatus 20 to attain a second SPL rating which is higher compared to a first SPL rating when only the first power line 28 (or any single power line) is connected to the first connector 24 (or any single connector). It should also be appreciated that in dual voice coil speakers, when only one coil of the dual voice coil speaker is powered, a performance of the dual voice coil speaker would be hampered.

In this regard, the apparatus 20 is able to utilize the plurality of data output connectors of the host device 22 which are already present in the host device 22 to both power the apparatus 20 and enhance the performance of the apparatus 20 (higher SPL rating). Thus, the apparatus 20 aids the user in relieving the user of the need to connect the apparatus 20 to a separate power source in order to power the apparatus 20 to deliver performance expected of the higher SPL rating.

Figure 2:
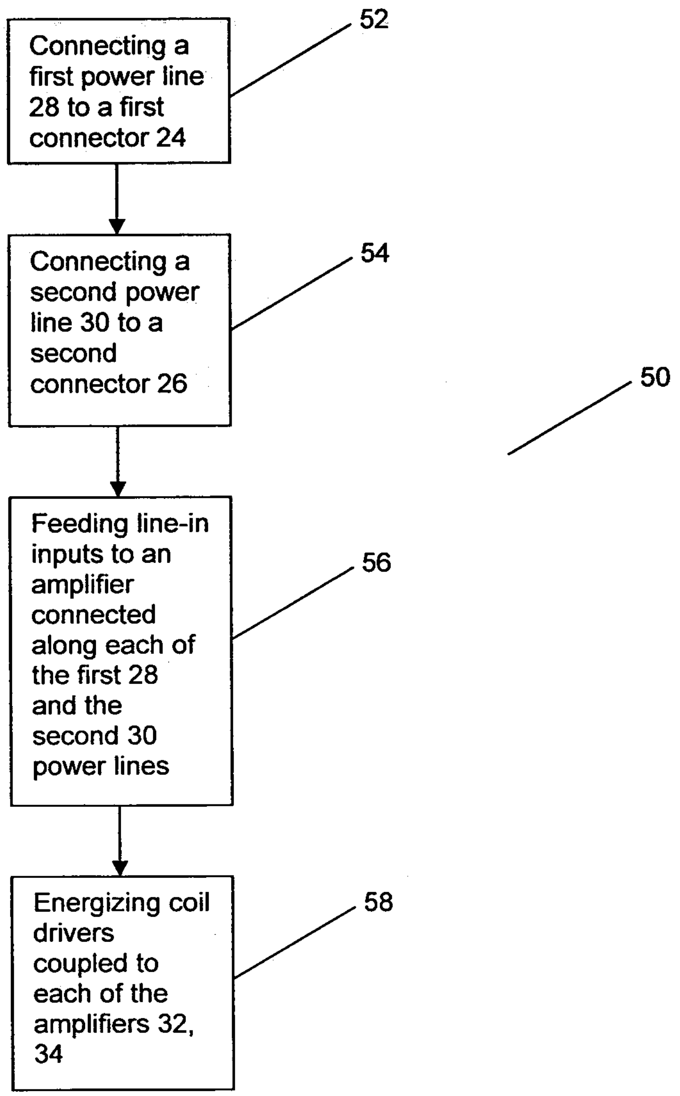
FIG. 2 shows a process flow for a preferred embodiment of the method.

In a second aspect of the present invention as shown in FIG. 2, there is shown a method 50 for amplifying audio content using an apparatus for amplification of audio content. The apparatus may be similar to the apparatus 20 as described in the preceding paragraphs of the description. For the sake of clarity, reference will be made to apparatus 20 as depicted in FIG. 1 to describe the method 50. The apparatus 20 may be powered by a host device 22 with a plurality of data output connectors. The host device 22 may include, for example, a PC, a notebook, a media player, and the like. The host device 22 may be known as such because power from the apparatus 20 is drawn from the host device 22.

The method 50 includes connecting a first power line 28 to a first connector 24 of the plurality of data output connectors of the host device 22 (52). Subsequently, the method 50 may include connecting a second power line 30 to a second connector 26 of the plurality of data output connectors of the host device 22 (54). Each of the plurality of data output connectors may be selected from, for example, a USB connector, an IEEE1394 connector, any connector that allows hot swapping, and so forth. The aforementioned examples of connectors are typically robust in construction and are able to withstand repeated couplings of the connector without affecting functional stability of the host device 22 after coupling of the data output connectors is performed.

The method 50 also includes feeding line-in analog inputs to an amplifier 32, 34 connected along each of the first 28 and the second 30 power lines (56). Each of the first 28 and the second 30 power lines may have constraints in relation to an amount of current which is able to pass through each of the first 28 and the second 30 power lines. It should be appreciated that a line-in input 36 may be either independent or combined with at least one of the plurality of data output connectors.

The method 50 also includes energizing coil drivers 38, 40 coupled to each of the amplifiers 34, 32 respectively with the coil drivers 38, 40 being arranged such that magnetic summation occurs when the coil drivers 38, 40 are energized. The coil drivers 38, 40 may be part of a dual voice coil speaker. Each amplifier 32, 34 may provide amplified line-in inputs to each respective coil driver 38, 40, where the coil drivers 38, 40 are for operation of a single speaker cone 42 of the apparatus 20. The coil drivers 38, 40 may be arranged in a manner such as per conventional dual voice coil speakers, typically in either a parallel or series arrangement. It should be appreciated that each of the coil drivers 38, 40 is not energized when a respective power line 30, 28 is disconnected from the plurality of data output connectors.

It is advantageous that the method 50 leads to the magnetic summation which causes the apparatus 20 to attain a second SPL rating which is higher compared to a first SPL rating when only the first power line 28 (or any single power line) is connected to the first connector 24 (or any single connector).

In this regard, the method 50 is also able to utilize the plurality of data output connectors of the host device 22 which are already present in the host device 22 to both power the apparatus 20 and enhance the performance of the apparatus 20 (higher SPL rating). Thus, the method 50 aids the user in relieving the user of the need to connect the apparatus 20 to a separate power source in order to power the apparatus 20 to deliver performance expected of the higher SPL rating.

Whilst there has been described in the foregoing description preferred embodiments of the present invention, it will be understood by those skilled in the technology concerned that many variations or modifications in details of design or construction may be made without departing from the present invention.

The invention claimed is:

1. An apparatus for amplification of audio content, the apparatus being powered by a host device with a plurality of data output connectors, the apparatus including:

- a first power line connectable to a first connector of the plurality of data output connectors;
- a second power line connectable to a second connector of the plurality of data output connectors;
- a first amplifier connected along the first power line and a second amplifier connected along the second power line; and
- a first coil driver and a second coil driver coupled to the first and second amplifiers respectively, the first and second coil drivers being arranged such that magnetic summation occurs when the first and second coil drivers are energized;

wherein the magnetic summation causes the apparatus to attain a second sound pressure level (SPL) rating which is higher compared to a first SPL rating when only the first power line is connected to the first connector.

2. The apparatus of claim 1, further including a line-in input for each of the amplifiers.

3. The apparatus of claim 2, wherein the line-in input is either through or combined with at least one of the plurality of data output connectors.

4. The apparatus of claim 1, wherein each of the plurality of data output connectors is selected from a group consisting of: a USB connector, an IEEE1394 connector, and any connector that allows hot swapping.

5. The apparatus of claim 1, wherein each of the coil drivers is not energized when a respective power line is disconnected from the plurality of data output connectors.

6. The apparatus of claim 1, wherein the coil drivers are for operation of a single speaker cone of the apparatus.

7. The apparatus of claim 1, wherein the coil drivers are arranged in either a parallel or a series arrangement.

8. The apparatus of claim 2, wherein each amplifier provides amplified line-in inputs to each respective coil driver.

* * * * *